United States Patent
Bushman et al.

(10) Patent No.: US 9,626,249 B1
(45) Date of Patent: Apr. 18, 2017

(54) AVOIDING COMPRESSION OF HIGH-ENTROPY DATA DURING CREATION OF A BACKUP OF A SOURCE STORAGE

(71) Applicant: STORAGECRAFT TECHNOLOGY CORPORATION, Draper, UT (US)

(72) Inventors: Nathan S. Bushman, Pleasant Grove, UT (US); Stephen Williams, South Jordan, UT (US)

(73) Assignee: STORAGECRAFT TECHNOLOGY CORPORATION, Draper, UT (US)

( * ) Notice: Subject to any disclaimer, the term of this patent is extended or adjusted under 35 U.S.C. 154(b) by 0 days.

(21) Appl. No.: 15/182,303

(22) Filed: Jun. 14, 2016

(51) Int. Cl.
*G06F 17/00* (2006.01)
*G06F 11/14* (2006.01)
*H03M 7/30* (2006.01)

(52) U.S. Cl.
CPC ...... *G06F 11/1448* (2013.01); *G06F 11/1464* (2013.01); *H03M 7/60* (2013.01); *G06F 2201/84* (2013.01)

(58) Field of Classification Search
CPC ......... G06F 17/30153; G06F 17/30545; G06F 2212/401; G06F 17/30445; G06F 3/0608
See application file for complete search history.

(56) References Cited

U.S. PATENT DOCUMENTS

2008/0133561 A1* 6/2008 Dubnicki ............ G06F 11/1453

* cited by examiner

Primary Examiner — Truong Vo
(74) Attorney, Agent, or Firm — Maschoff Brennan

(57) ABSTRACT

Avoiding compression of high-entropy data during creation of a backup of a source storage. In one example embodiment, a method for avoiding compression of high-entropy data during creation of a backup of a source storage may include identifying a chunk with an original size in a file in a source storage, compressing, during creation of a backup of the source storage, the chunk to generate a compressed chunk with a compressed size, determining a compression ratio for the chunk by comparing the original size to the compressed size, determining whether the compression ratio is less than the compression threshold, and, in response to determining that the compression ratio is less than the compression threshold, automatically designating the file as a high-entropy file and automatically avoiding compression, during the creation of the backup, of chunks in a second similar file in the source storage.

20 Claims, 3 Drawing Sheets

AVOIDING COMPRESSION OF HIGH-ENTROPY DATA DURING CREATION OF A BACKUP OF A SOURCE STORAGE

FIELD

The embodiments disclosed herein relate to avoiding compression of high-entropy data during creation of a backup of a source storage.

BACKGROUND

A storage is computer-readable media capable of storing data in blocks. Storages face a myriad of threats to the data they store and to their smooth and continuous operation. In order to mitigate these threats, a backup of the data in a storage may be created to represent the state of the source storage at a particular point in time and to enable the restoration of the data at some future time. Such a restoration may become desirable, for example, if the storage experiences corruption of its stored data, if the storage becomes unavailable, or if a user wishes to create a second identical storage.

A storage is typically logically divided into a finite number of fixed-length blocks. A storage also typically includes a file system which tracks the locations of the blocks that are allocated to each file that is stored in the storage. The file system also tracks the blocks that are not allocated to any file. The file system generally tracks allocated and unallocated blocks using specialized data structures, referred to as file system metadata. File system metadata is also stored in designated blocks in the storage.

Various techniques exist for backing up a source storage. One common technique involves backing up individual files stored in the source storage on a per-file basis. This technique is often referred to as file backup. File backup uses the file system of the source storage as a starting point and performs a backup by writing the files to a destination storage. Using this approach, individual files are backed up if they have been modified since the previous backup. File backup may be useful for finding and restoring a few lost or corrupted files. However, file backup may also include significant overhead in the form of bandwidth and logical overhead because file backup may require the tracking and storing of information about where each file exists within the file system of the source storage and the destination storage.

Another common technique for backing up a source storage ignores the locations of individual files stored in the source storage and instead simply backs up all allocated blocks stored in the source storage. This technique is often referred to as image backup because the backup generally contains or represents an image, or copy, of the entire allocated contents of the source storage. Using this approach, individual allocated blocks are backed up if they have been modified since the previous backup. Because image backup backs up all allocated blocks of the source storage, image backup backs up both the blocks that make up the files stored in the source storage as well as the blocks that make up the file system metadata. Also, because image backup backs up all allocated blocks rather than individual files, this approach does not generally need to be aware of the file system metadata or the files stored in the source storage, beyond utilizing minimal knowledge of the file system metadata in order to only back up allocated blocks since unallocated blocks are not generally backed up.

An image backup can be relatively fast compared to file backup because reliance on the file system is minimized. An image backup can also be relatively fast compared to a file backup because seeking is reduced. In particular, during an image backup, blocks are generally read sequentially with relatively limited seeking. In contrast, during a file backup, blocks that make up the content of individual files may be scattered, resulting in relatively extensive seeking.

One common problem that is encountered during successive file backups of a source storage or successive image backups of the source storage relates to the proliferation of backups over time. For example, where a source storage is backed up every day at 2:00 am to a destination storage, after one year 365 backups will exist for the source storage on the destination storage. This proliferation of backups can increase the amount of storage space needed to store the backups on the destination storage. This problem has been mitigated to some extent by compression schemes which are employed to compress data before storing the data in a backup, thus reducing the size of each backup and saving storage space. In particular, these compression schemes typically attempt compression on all data from a source storage that is targeted for backup. This attempted compression consumes memory and processing resources. However, these compression schemes have introduced a problem of wasted resources in source storages with high-entropy data, including data from files that already have a compressed data format such as an .MP3 file format or a .ZIP file format. The problem of wasted resources results from the memory and processing resources employed during attempts at compression of high-entropy data being wasted since high-entropy data cannot be further compressed effectively.

The subject matter claimed herein is not limited to embodiments that solve any disadvantages or that operate only in environments such as those described above. Rather, this background is only provided to illustrate one example technology area where some embodiments described herein may be practiced.

SUMMARY

In general, example embodiments described herein relate to avoiding compression of high-entropy data during creation of a backup of a source storage. The example embodiments disclosed herein may be employed to identify a high-entropy chunk in a file in a source storage while backing up the source storage, and then later automatically avoid compression of chunks in similar files during the backup of the source storage. By identifying and automatically designating a particular file as having a high-entropy chunk, the wasting of memory and processing resources while unsuccessfully attempting to compress high-entropy chunks in similar files can be avoided.

In one example embodiment, a method for avoiding compression of high-entropy data during creation of a backup of a source storage may include identifying a chunk with an original size in a file in a source storage, compressing, during creation of a backup of the source storage, the chunk to generate a compressed chunk with a compressed size, determining a compression ratio for the chunk by comparing the original size to the compressed size, determining whether the compression ratio is less than the compression threshold, and, in response to determining that the compression ratio is less than the compression threshold, automatically designating the file as a high-entropy file and automatically avoiding compression, during the creation of the backup, of chunks in a second similar file in the source storage.

It is to be understood that both the foregoing summary and the following description of embodiments are explanatory and are not restrictive of the invention as claimed.

BRIEF DESCRIPTION OF THE DRAWINGS

Example embodiments will be described and explained with additional specificity and detail through the use of the accompanying drawings in which.

DESCRIPTION OF EMBODIMENTS

The term "storage" as used herein refers to computer-readable media capable of storing data in blocks, such as one or more floppy disks, optical disks, magnetic disks, or solid state (flash) disks, or some logical portion thereof such as a volume. The term "block" as used herein refers to a fixed-length discrete sequence of bits. In some file systems, blocks are sometimes referred to as "clusters." In some example embodiments, the size of each block may be configured to match the standard sector size of a storage on which the block is stored. For example, the size of each block may be 512 bytes (4096 bits) where 512 bytes is the size of a standard sector. In other example embodiments, the size of each block may be configured to be a multiple of the standard sector size of a storage on which the block is stored. For example, the size of each block may be 4096 bytes (32,768 bits) where 512 bytes (4096 bits) is the size of a standard sector, which results in each block including eight sectors. In some file systems, a block is the allocation unit of the file system, with the allocated blocks and free blocks being tracked by the file system. The term "allocated block" as used herein refers to a block in a storage that is currently tracked as storing data, such as file content data or metadata, by a file system of the storage. The term "free block" as used herein refers to a block in a storage that is not currently tracked as storing data, such as file content data or metadata, by a file system of the storage. The term "chunk" as used herein refers to a group of one or more blocks. The term "backup" when used herein as a noun refers to a copy or copies of one or more blocks from a storage. The term "file backup" as used herein refers to a copy or copies of one or more files from a storage. The term "image backup" as used herein refers to a backup of a storage that includes at least a copy of each unique allocated block of the storage at a point in time such that the image backup can be restored to recreate the state of the storage at the point in time. An "image backup" may also include nonunique allocated blocks and free blocks of the storage at the point in time. Example file formats for an "image backup" include the ShadowProtect Full (SPF) image backup format and the ShadowProtect Incremental (SPI) image backup format. It is understood that an "image backup" may exclude certain undesired allocated blocks such as content blocks belonging to files whose contents are not necessary for restoration purposes, such as virtual memory pagination files and machine hibernation state files.

Figure 1:
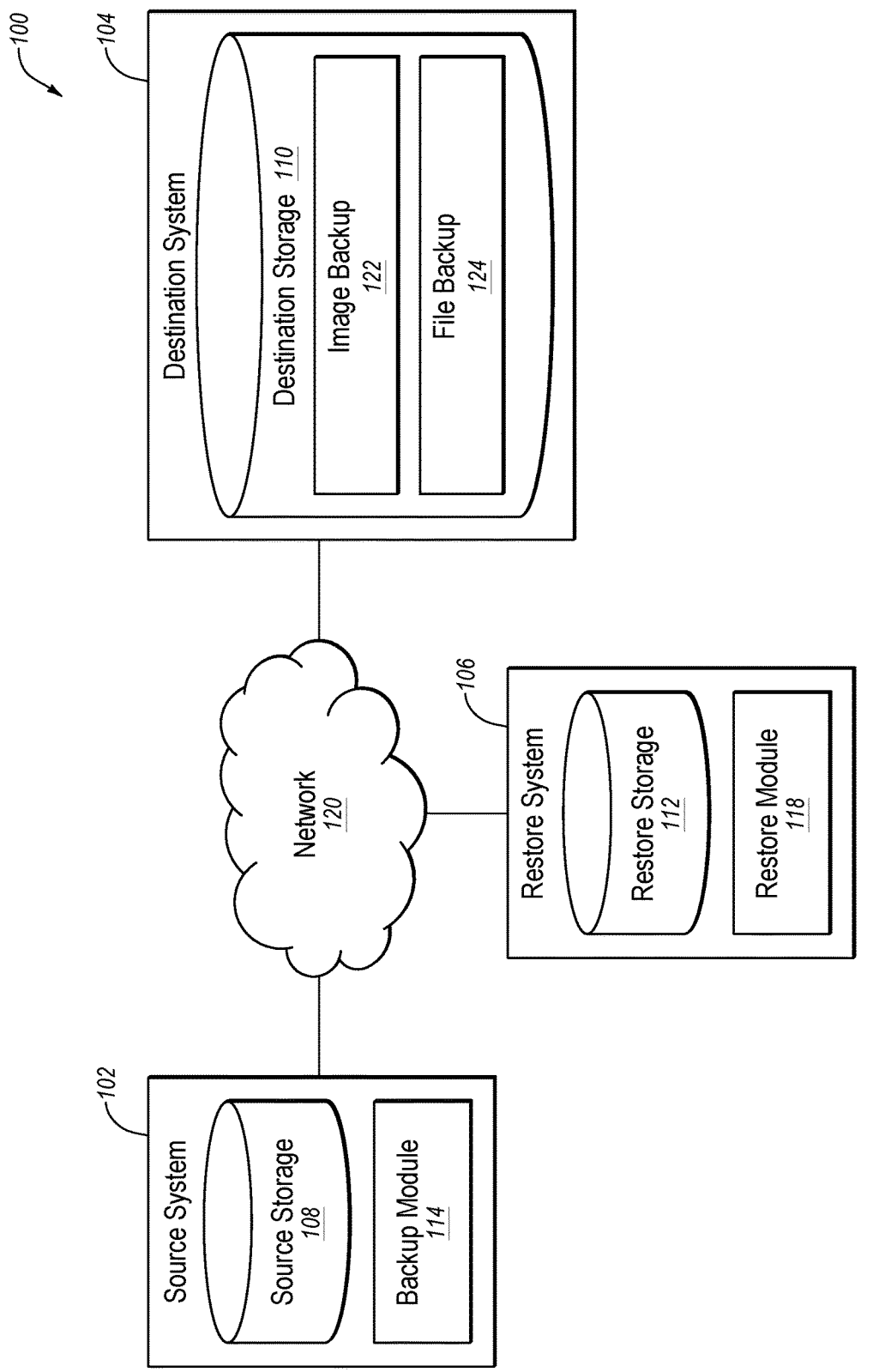
FIG. 1 is a schematic block diagram illustrating an example backup and restore system.

FIG. 1 is a schematic block diagram illustrating an example backup and restore system 100. As disclosed in FIG. 1, the system 100 may include a source system 102, a destination system 104, and a restore system 106. The systems 102, 104, and 106 may include storages 108, 110, and 112, respectively. The source system 102 may also include a backup module 114 and the restore system 106 may also include a restore module 118. The systems 102, 104, and 106 may be configured to communicate with one another over a network 120.

The destination storage 110 may store one or more backups of the source storage 108. For example, the destination storage 110 may store an image backup 122 and/or a file backup 124. The image backup 122 or the file backup 124 may be restored to the restore storage 112.

Each of the systems 102, 104, and 106 may be any computing device capable of supporting a storage and communicating with other systems including, for example, file servers, web servers, personal computers, desktop computers, laptop computers, handheld devices, multiprocessor systems, microprocessor-based or programmable consumer electronics, smartphones, digital cameras, hard disk drives, flash memory drives, and virtual machines running on hypervisors. The network 120 may be any wired or wireless communication network including, for example, a Local Area Network (LAN), a Metropolitan Area Network (MAN), a Wide Area Network (WAN), a Wireless Application Protocol (WAP) network, a Bluetooth network, an Internet Protocol (IP) network such as the Internet, or some combination thereof. The network 120 may also be a network emulation of a hypervisor over which one or more virtual machines and/or physical machines may communicate.

The image backup 122 and/or file backup 124 stored in the destination storage 110 may be created by the backup module 114. For example, the backup module 114 may be one or more programs that are configured, when executed, to cause one or more processors to perform image backup operations of creating the image backup 122 of the source storage 108 and/or creating the file backup 124 of the source storage 108. It is noted that these backups may initially be created on the source system 102 and then copied to the destination system 104.

In one example embodiment, the destination system 104 may be a network server, the source system 102 may be a first desktop computer, the source storage 108 may be a volume on one or more magnetic hard drives of the first desktop computer, the restore system 106 may be a second desktop computer, the restore storage 112 may be a volume on one or more magnetic hard drives of the second desktop computer, and the network 120 may include the Internet. In this example embodiment, the first desktop computer may be configured to periodically back up the volume of the first desktop computer over the Internet to the network server as part of a backup job by creating the image backup 122 and/or the file backup 124. The second desktop computer may also be configured to restore one or more of the image backup 122 and the file backup 124 from the network server over the Internet to the volume of the second desktop computer if the first desktop computer experiences corruption of its volume or if the first desktop computer's volume becomes unavailable.

Although only a single storage is disclosed in each of the systems 102, 104, and 106 in FIG. 1, it is understood that any of the systems 102, 104, and 106 may instead include two or more storages. Further, although the systems 102, 104, and 106 are disclosed in FIG. 1 as communicating over the network 120, it is understood that the systems 102, 104, and 106 may instead communicate directly with each other. For example, in some embodiments any combination of the systems 102, 104, and 106 may be combined into a single system, including embodiments where the source storage 108 represents the same storage as the restore storage 112. Also, although only a single image backup 122 and only a single file backup 124 are disclosed in FIG. 1, it is understood that the multiple backups of the source storage 108 may be created, such as an incremental image backup chain that includes a full image backup and one or more incremental image backups, a decremental image backup chain that includes a full image backup and one or more decremental image backups, an incremental file backup chain that includes a full file backup and one or more incremental file backups, or a decremental file backup chain that includes a full file backup and one or more decremental file backups. Further, although the backup module 114 and the restore module 118 are the only modules disclosed in the system 100 of FIG. 1, it is understood that the functionality of the modules 114 and 118 may be replaced or augmented by one or more similar modules residing on any of the systems 102, 104, or 106 or another system. Finally, although only a single source storage and a single restore storage are disclosed in the system 100 of FIG. 1, it is understood that the destination system 104 of FIG. 1 may be configured to simultaneously back up multiple source storages and/or to simultaneously restore to multiple restore storages. For example, where the destination system 104 is configured as a deduplication system (that is capable of removing duplicate blocks or duplicate files within backups and/or is capable of removing duplicate blocks or duplicate files between backups), the greater the number of storages that are backed up to the destination storage 110 of the destination system 104, the greater the likelihood for reducing redundancy and for reducing the overall number of blocks being backed up, resulting in corresponding decreases in the overall size requirements of the destination storage 110 and in the bandwidth overhead of transporting blocks to the destination storage 110.

Having described one specific environment with respect to FIG. 1, it is understood that the specific environment of FIG. 1 is only one of countless environments in which the example methods disclosed herein may be practiced. The scope of the example embodiments is not intended to be limited to any particular environment.

Figure 2:
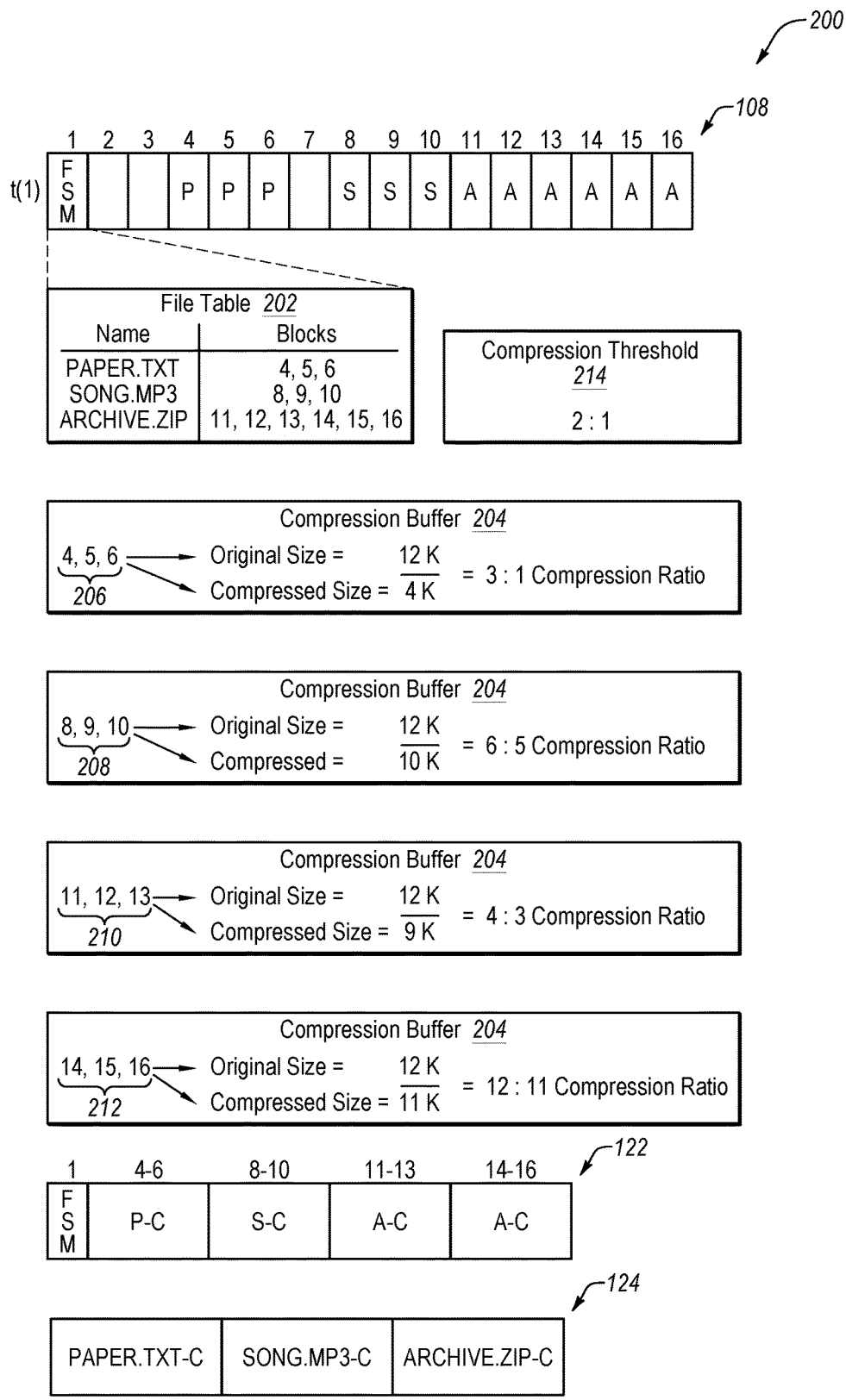
FIG. 2 is a schematic block diagram illustrating an example source storage, an example compression buffer, an example image backup of the source storage, and an example file backup of the source storage.

FIG. 2 is a schematic block diagram illustrating the example source storage 108, an example compression buffer 204, the example image backup 122 of the source storage 108, and the example file backup 124 of the source storage 108. The source storage 108 is disclosed in FIG. 2 in a first state at time t(1). Although the source storage 108 is depicted with sixteen blocks in FIG. 2, it is understood that the source storage 108 may include millions or billions of blocks, or potentially even more blocks. The blocks in FIG. 2 having a label therein represent blocks that are allocated at the time indicated, while the blank blocks represent blocks that are free at the time indicated. The labels in the blocks of FIG. 2 include a letter to identify the block as corresponding to file content of a particular file. For example, the label "P" in various blocks in FIG. 2 identifies the blocks as corresponding to file content of a file named "PAPER.TXT."

As disclosed in FIG. 2, at time t(1) the source storage 108 includes file system metadata (FSM) in block (1). The FSM includes a file table 202. The file table 202 may be employed to track, at the time indicated, file information, such as a file name and file blocks for the files stored in the source storage 108. For example, the file table 202 tracks three files at time t(1), namely, a file named "PAPER.TXT" in blocks (4), (5), and (6), a file named "SONG.MP3" in blocks (8), (9), and (10), and a file named "ARCHIVE.ZIP" in blocks (11), (12), (13), (14), (15), and (16).

Each of the image backup 122 and the file backup 124 represents the state of the source storage 108 at time t(1). As disclosed in FIGS. 1 and 2, in one example embodiment, the backup module 114 may create the image backup 122 and/or the file backup 124 on the source system 102 and then store the backup in the destination storage 110 of the destination system 104. As disclosed in FIG. 2, the creation of the image backup 122 may include the backup module 114 copying all allocated blocks of the source storage 108 as allocated at time t(1) and storing the allocated blocks in the image backup 122. For example, blocks (1), (4), (5), (6), (8), (9), (10), (11), (12), (13), (14), (15), and (16) are allocated in the source storage 108 at time t(1), and these blocks are therefore stored as part of the image backup 122. Similarly, the creation of the file backup 124 may include the backup module 114 copying all files of the source storage 108 present at time t(1) and storing the files in the file backup 124. For example, files named "PAPER.TXT," "SONG.MP3," and "ARCHIVE.ZIP" are present in the source storage 108 at time t(1), and these files are therefore stored as part of the file backup 124. The file backup 124 may also include some or all of the FSM from block (1). However, it is noted that prior to being stored in the image backup 122 and/or the file backup 124, the blocks of the source storage 108 may be grouped as chunks compressed using the compression buffer 204.

As disclosed in FIG. 2, the compression buffer 204 may be capable of temporarily storing a copy of a chunk of the source storage 108 (i.e., one or more blocks of the source storage 108) so that the chunk may be compressed prior to being stored in the image backup 122 and/or the file backup 124. For example, as disclosed in FIG. 2, the compression buffer 204 may first temporarily store a first chunk 206 that includes blocks (4), (5), and (6) which can be determined to be from the file named "PAPER.TXT" using the file table 202. The first chunk 206 has an original size of 12 KB (i.e., each of the three blocks has an original size of 4K), but after compression the first chunk has a compressed size of 4K. The original size can be compared to the compressed size to determine a compression ratio of 3:1. Next, the compression buffer 204 may temporarily store a second chunk 208 that includes blocks (8), (9), and (10) from the file named "SONG.MP3," with an original size of 12K, and a compressed size of 10K, resulting in a compression ratio of 6:5. Next, the compression buffer 204 may temporarily store a third chunk 210 that includes blocks (11), (12), and (13) from the file named "ARCHIVE.ZIP," with an original size of 12K, and a compressed size of 9K, resulting in a compression ratio of 4:3. Finally, the compression buffer 204 may temporarily store a fourth chunk 212 that includes blocks (14), (15), and (16) from the file named "ARCHIVE.ZIP," with an original size of 12K, and a compressed size of 11K, resulting in a compression ratio of 12:11. Although the chunks in FIG. 2 are illustrated as only including 3 blocks and only being 12K in size, it is understood that in practice chunks may actually include more blocks. For example, each chunk may include 256 blocks that are each 4K in size, resulting in a chunk with a size of 1M.

After compression of the chunks using the compression buffer 204, the image backup 122 may be created by copying the FSM from block (1) of the source storage 108 (which itself may also be compressed) and/or copying the first, second, third, and fourth compressed chunks from the compression buffer 204 into the image backup 122. Similarly, the file backup 124 may be created by copying the first compressed chunk as a compressed version of the file named "PAPER.TXT," copying the second compressed chunk as a compressed version of the file named "SONG.MP3," and copying the third and fourth compressed chunks as a compressed version of the file named "ARCHIVE.ZIP" into the file backup 124. However, as disclosed in FIG. 2, the compression using the compression buffer 204 was relatively successful with the first chunk 206 with a compression ratio of 3:1, while the compression was relatively unsuccessful with the second, third, and fourth chunks 208, 210, and 212 with compression ratios of 6:5, 4:3, and 12:11, respectively. Since the relatively unsuccessful compression of the second, third, and fourth chunks 208, 210, and 212 may not be worth the memory and processing resources required to attempt compression, and potential future decompression, of the chunks, the example methods disclosed herein may be employed to automatically designate these chunks as being from high-entropy files and then automatically avoiding any subsequent attempts to compress chunks from similar files in order to avoid wasting memory and processing resources.

For example, a compression threshold may be determined, such as a compression threshold 214 of 2:1, and then the compression ratios of chunks compressed in the compression buffer 204 may be compared to the compression threshold 214. Where the compression ratio achieved in the compression buffer 204 is less than the compression threshold 214, resulting in wasted memory and processing resources, the file to which the chunk belongs may be determined to be a high-entropy file, and compression on similar files that are subsequently encountered can be automatically avoided to avoid subsequently wasting memory and processing resources. In this example, the compression ratios of 6:5, 4:3, and 12:11 that were achieved for each of the second, third, and fourth chunks 208, 210, and 212, respectively, are less than the compression threshold 214 of 2:1. Since the second chunk 208 belongs to the file named "SONG. MP3," this file may be determined to be a high-entropy file, and compression of content of similar files, such as files having the same file type and/or the same ".MP3" file extension, may subsequently be automatically avoided. Similarly, since the third and fourth chunks 210 and 212 belong to the file name "ARCHIVE.ZIP," this file may be determined to be a high-entropy file, and compression of content of similar files, such as files having the same file type and/or the same ".ZIP" file extension, may subsequently be automatically avoided.

Therefore, as disclosed in FIG. 2, the example embodiments disclosed herein may be employed to identify a high-entropy chunk in a file in the source storage 108 while backing up the source storage 108, and then later automatically avoid compression of chunks in similar files during the backup of the source storage 108 or during the backup of another storage. By identifying and automatically designating a particular file as having a high-entropy chunk, the wasting of memory and processing resources while unsuccessfully attempting to compress high-entropy chunks in similar files may be avoided.

Figure 3:
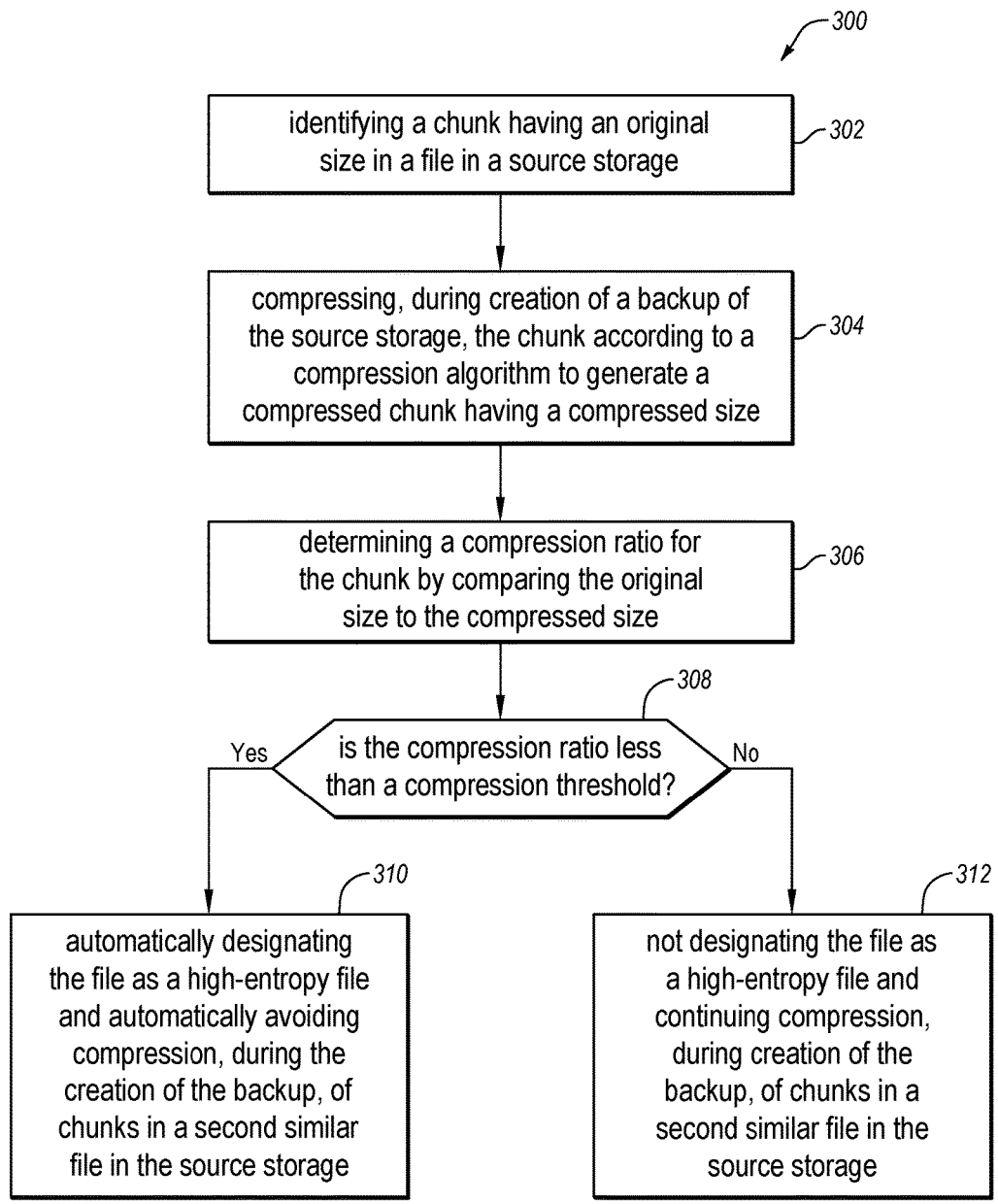
FIG. 3 is a schematic flowchart illustrating an example method for avoiding compression of high-entropy data during creation of a backup of a source storage.

FIG. 3 is a schematic flowchart illustrating an example method 300 for avoiding compression of high-entropy data during creation of a backup of a source storage. The method 300 may be implemented, in at least some embodiments, by the backup module 114 of FIG. 1. For example, the backup module 114 may be one or more programs, stored on one or more non-transitory computer-readable media, that are configured, when executed, to cause one or more processors to perform one or more of the steps of the method 300. Although illustrated as discrete steps, various steps may be divided into additional steps, combined into fewer steps, reordered, or eliminated, depending on the desired implementation. The method 300 will be discussed with reference to FIGS. 1, 2, and 3.

The method 300 of FIG. 3 may include step 302 of identifying a chunk having an original size in a file in a source storage. For example, the backup module 114 of FIG. 1 may identify, at step 302, the first chunk 206 having an original size of 12K in the file named "PAPER.TXT" in the source storage 108, as disclosed in FIG. 2. In another example, the backup module 114 of FIG. 1 may identify, at step 302, the third chunk 210 having an original size of 12K in the file named "ARCHIVE.ZIP" in the source storage 108, as disclosed in FIG. 2. As noted previously, the files to which the first chunk 206 and the third chunk 210 belong may be identified using the file table 202. Further, the file type and/or file extension of the files named "PAPER.TXT" and "ARCHIVE.ZIP" may also be identified using the file table 202.

The method 300 of FIG. 3 may include step 304 of compressing, during creation of a backup of the source storage, the chunk according to a compression algorithm to generate a compressed chunk having a compressed size. For example, the backup module 114 of FIG. 1 may compress, during the creation of the image backup 122 or the file backup 124, at step 304, the first chunk 206 according to a compression algorithm to generate a compressed chunk having a compressed size of 4K, as disclosed in FIG. 2. In another example, the backup module 114 of FIG. 1 may compress, during the creation of the image backup 122 or the file backup 124, at step 304, the third chunk 210 according to a compression algorithm to generate a compressed chunk having a compressed size of 9K, as disclosed in FIG. 2. The compression algorithm employed at step 304 may be a lossless compression algorithm such as delta encoding, run-length encoding, entropy encoding, or PPM encoding, for example.

The method 300 of FIG. 3 may include step 306 of determining a compression ratio for the chunk by comparing the original size to the compressed size. For example, the backup module 114 of FIG. 1 may determine, at step 306, that the compression ratio for the first chunk 206 is a compression ratio of 3:1 or that the compression ratio for the third chunk 210 is a compression ratio of 4:3.

The method 300 of FIG. 3 may include decision step 308 in which it is determined whether the compression ratio is less than a compression threshold. For example, the backup module 114 of FIG. 1 may determine, at decision step 308, whether the compression ratio of the first chunk 206 of 3:1 is less than the compression threshold 214 of 2:1, as disclosed in FIG. 2. In another example, the backup module 114 of FIG. 1 may determine, at decision step 308, whether the compression ratio of the third chunk 210 of 4:3 is less than the compression threshold 214 of 2:1, as disclosed in FIG. 2.

If it is determined at decision step 308 that the compression ratio is less than the compression threshold (Yes at decision step 308), then the method 300 of FIG. 3 may include step 310 of automatically designating the file as a high-entropy file and automatically avoiding compression, during the creation of the backup, of chunks in a second similar file in the source storage. For example, the backup module 114 of FIG. 1 may automatically designate, at step 310, the file named "ARCHIVE.ZIP" as a high-entropy file due to the third chunk 210 not compressing at least as much as the compression threshold 214, and may therefore subsequently automatically avoid compression, during the creation of the image backup 122 or the file backup 124, of chunks in a second similar file in the source storage 108, as disclosed in FIG. 2. A second similar file may be a file with the same file type and/or the same file extension, for example. Further, in at least some example embodiments, the file type of a file may be designated by the file extension of the file and/or the file name of the file.

The automatically designating at step 310 may include automatically adding the file name of the file, the file type of the file, and/or the file extension of the file to a compression exclusion list. The compression exclusion list may then be checked before subsequent compression attempts to automatically avoid compression attempts on chunks from files with a matching file name, a matching file type, and/or a matching file extension, including automatically avoiding subsequent compression attempts on chunks from the same file. Therefore, it is understood that when subsequent compression attempts are avoided for "similar files," the "similar files" may include the same file, including subsequent versions of the same file.

Further, in addition to automatically avoiding compression, at step 310, of chunks in a second similar file in the source storage, step 310 may further include automatically avoiding compression, during creation of the backup of the source storage, of additional chunks in the file. For example, due to the third chunk 210 not compressing at least as much as the compression threshold 214, the backup module 114 of FIG. 1 may automatically avoid compression, at step 310, of the fourth chunk 212 since the fourth chunk 212 belongs to the same file as the third chunk 210.

Also, the automatically avoiding compression at step 310 may further be performed during creation of a second backup of a second source storage, thereby benefiting not only backups of the source storage where the original high-entropy data was identified, but also benefiting one or more additional storages.

Further, the automatically designating and the automatically avoiding, at step 310, may further be performed in response to also determining that compression ratios of a threshold number of additional chunks in one or more files in the source storage having the same file type and/or the same file extension as the file are also less than the compression threshold, thereby potentially increasing the confidence that the high-entropy data is not only present in a single chunk of a single file, but is also consistently present in a threshold number of chunks of one or more files having the same file type and/or file extension.

Also, the automatically designating and the automatically avoiding, at step 310, may further be performed in response to also determining that compression ratios of chunks in a threshold number of additional files in the source storage having the same file type and/or the same file extension as the file are also less than the compression threshold, thereby potentially increasing the confidence that the high-entropy data is not only present in a single file, but is also consistently present in a threshold number of other files having the same file type and/or file extension.

It is understood that the identifying at step 302 may include identifying the file to which the chunk belongs after a determining at decision step 308 that the compression ratio is less than the compression threshold, since identifying the file to which the chunk belongs may not be beneficial, particularly in an image backup, if the compression ratio is not less than the compression threshold.

If it is determined at decision step 308 that the compression ratio is not less than the compression threshold (No at decision step 308), then the method 300 of FIG. 3 may include step 312 of not designating the file as a high-entropy file and continuing compression, during the creation of the backup, of chunks in a second similar file in the source storage. For example, the backup module 114 of FIG. 1 may not designate, at step 312, the file named "PAPER.TXT" as a high-entropy file due to the first chunk 206 compressing more than the compression threshold 214, and may therefore subsequently continue compression, during the creation of the image backup 122 or the file backup 124, of chunks in a second similar file in the source storage 108, as disclosed in FIG. 2.

Therefore, the example method 300 disclosed herein may be employed to identify a high-entropy chunk in a file in the source storage 108 while backing up the source storage 108, and then later automatically avoid compression of chunks in similar files during the backup of the source storage 108 or during the backup of another storage. By identifying and automatically designating a particular file as having a high-entropy chunk, the wasting of memory and processing resources while unsuccessfully attempting to compress high-entropy chunks in similar files may be avoided.

It is understood that the foregoing discussion of the method 300 is but one possible implementation of a method for avoiding compression of high-entropy data during creation of a backup of a source storage, and various modifications are possible and contemplated. For example, the method 300 may be modified to combine steps 302 and 304 and/or combine steps 306 and/or 308.

Further, the method 300 may improve the functioning of a computer itself. For example, the functioning of the source system 102 (i.e., a computing device capable of supporting a storage and communicating with other systems) itself may be improved by the method 300 at least because the creation of the backup of the source storage 108 of the source system 102 during the method 300 may enable the restoration of the source storage 108 if, for example, the source storage 108 experiences corruption of its stored data, the source storage 108 becomes unavailable, or a user wishes to create a second identical or virtual source storage 108. Also, the method 300 may improve the technical field of backup and disaster recovery (BDR). For example, the technical field of BDR may be improved by the method 300 at least because prior art backup methods for the source storage 108 did not enable a user to avoid compression of high-entropy chunks by automatically designating a particular file as a high-entropy file and automatically avoiding compression of subsequent similar files, whereas the method 300 may be employed to automatically designate a high-entropy file and automatically avoid compression of subsequent similar files.

The embodiments described herein may include the use of a special-purpose or general-purpose computer, including various computer hardware or software modules, as discussed in greater detail below.

Embodiments described herein may be implemented using non-transitory computer-readable media for carrying or having computer-executable instructions or data structures stored thereon. Such computer-readable media may be any available media that may be accessed by a general-purpose or special-purpose computer. By way of example, and not limitation, such computer-readable media may include non-transitory computer-readable storage media including RAM, ROM, EEPROM, CD-ROM or other optical disk storage, magnetic disk storage or other magnetic storage devices, or any other storage medium which may be used to carry or store one or more desired programs having program code in the form of computer-executable instructions or data structures and which may be accessed and executed by a general-purpose computer, special-purpose computer, or virtual computer such as a virtual machine. Combinations of the above may also be included within the scope of computer-readable media.

Computer-executable instructions comprise, for example, instructions and data which, when executed by one or more processors, cause a general-purpose computer, special-purpose computer, or virtual computer such as a virtual machine to perform a certain method, function, or group of methods or functions. Although the subject matter has been described in language specific to structural features and/or methodological steps, it is to be understood that the subject matter defined in the appended claims is not necessarily limited to the specific features or steps described above. Rather, the specific features and steps described above are disclosed as example forms of implementing the claims.

As used herein, the term "module" may refer to software objects or routines that execute on a computing system. The different modules described herein may be implemented as objects or processes that execute on a computing system (e.g., as separate threads). While the system and methods described herein are preferably implemented in software, implementations in hardware or a combination of software and hardware are also possible and contemplated.

All examples and conditional language recited herein are intended for pedagogical objects to aid the reader in understanding the example embodiments and the concepts contributed by the inventor to furthering the art, and are to be construed as being without limitation to such specifically-recited examples and conditions.

The invention claimed is:

1. A method for avoiding compression of high-entropy data during creation of a backup of a source storage, the method comprising:
   identifying a chunk in a file in a source storage, the file having a file type, the chunk having an original size;
   compressing, during creation of a backup of the source storage, the chunk to generate a compressed chunk, the compressed chunk having a compressed size;
   determining a compression ratio for the chunk by comparing the original size to the compressed size;
   determining whether the compression ratio is less than a compression threshold; and
   in response to determining that the compression ratio is less than the compression threshold, automatically designating the file type as a high-entropy file type and automatically avoiding compression, during the creation of the backup, of chunks in a second file in the source storage having the file type.

2. The method as recited in claim 1, wherein the identifying includes identifying the file to which the chunk belongs after the determining that the compression ratio is less than the compression threshold.

3. The method as recited in claim 1, wherein the file type of the file is designated by a file extension of the file.

4. The method as recited in claim 3, wherein the automatically designating includes automatically adding the file extension to a compression exclusion list.

5. The method as recited in claim 1, wherein the file type of the file is designated by a file name of the file.

6. The method as recited in claim 5, wherein the automatically designating includes automatically adding the file name to a compression exclusion list.

7. The method as recited in claim 1, further comprising:
   in response to determining that the compression ratio is less than the compression threshold, automatically avoiding compression, during creation of the backup of the source storage, of additional chunks in the file.

8. The method as recited in claim 1, further comprising:
   in response to determining that the compression ratio is less than the compression threshold, automatically avoiding compression, during creation of a second backup of a second source storage, of chunks in any files in the second source storage having the file type.

9. The method as recited in claim 1, wherein:
   the automatically designating and the automatically avoiding are further performed in response to also determining that compression ratios of a threshold number of additional chunks in one or more files in the source storage having the file type are also less than the compression threshold.

10. The method as recited in claim 1, wherein:
    the automatically designating and the automatically avoiding are further performed in response to also determining that compression ratios of chunks in a threshold number of additional files in the source storage having the file type are also less than the compression threshold.

11. One or more non-transitory computer-readable media storing one or more programs that are configured, when executed, to cause one or more processors to execute the method as recited in claim 1.

12. A method for avoiding compression of high-entropy data during creation of a backup of a source storage, the method comprising:
    identifying a chunk in a file in a source storage, the file having a file extension, the chunk having an original size;
    compressing, during creation of a backup of the source storage, the chunk to generate a compressed chunk, the compressed chunk having a compressed size;
    determining a compression ratio for the chunk by comparing the original size to the compressed size;
    determining whether the compression ratio is less than a compression threshold; and
    in response to determining that the compression ratio is less than the compression threshold, automatically designating the file extension as a high-entropy file extension and automatically avoiding compression, during the creation of the backup, of chunks in a second file in the source storage having the file extension.

13. The method as recited in claim 12, wherein:
    the backup is an image-based backup of the source storage; and
    the identifying includes identifying the file to which the chunk belongs after the determining that the compression ratio is less than the compression threshold.

14. The method as recited in claim 12, wherein the backup is a file-based backup of the source storage.

15. The method as recited in claim 12, wherein the automatically designating includes adding the file extension to a compression exclusion list.

16. The method as recited in claim 12, further comprising:
    in response to determining that the compression ratio is less than the compression threshold, automatically avoiding compression, during creation of the backup of the source storage, of additional chunks in the file.

17. The method as recited in claim 12, further comprising:
in response to determining that the compression ratio is less than the compression threshold, automatically avoiding compression, during creation of a second backup of a second source storage, of chunks in any files in the second source storage having the file extension.

18. The method as recited in claim 12, wherein:
the automatically designating and the automatically avoiding are further performed in response to also determining that compression ratios of a threshold number of additional chunks in one or more files in the source storage having the file extension are also less than the compression threshold.

19. The method as recited in claim 12, wherein:
the automatically designating and the automatically avoiding are further performed in response to also determining that compression ratios of chunks in a threshold number of additional files in the source storage having the file extension are also less than the compression threshold.

20. One or more non-transitory computer-readable media storing one or more programs that are configured, when executed, to cause one or more processors to execute the method as recited in claim 12.

* * * * *